(12) United States Patent
Wang et al.

(10) Patent No.: US 7,359,272 B2
(45) Date of Patent: Apr. 15, 2008

(54) CIRCUIT AND METHOD FOR AN SRAM WITH REDUCED POWER CONSUMPTION

(75) Inventors: Ping-Wei Wang, Hsin-Chu (TW);
Yuh-Jier Mii, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/506,438

(22) Filed: Aug. 18, 2006

(65) Prior Publication Data

US 2008/0043561 A1    Feb. 21, 2008

(51) Int. Cl.
*G11C 7/00* (2006.01)
(52) U.S. Cl. .................... 365/226; 365/205
(58) Field of Classification Search ........... 365/226, 365/205
See application file for complete search history.

(56) References Cited

U.S. PATENT DOCUMENTS

| | | |
|---|---|---|
| 6,839,297 B2 | 1/2005 | Lovett |
| 6,891,745 B2 | 5/2005 | Liaw |
| 7,023,056 B2 | 4/2006 | Liaw |
| 2005/0253287 A1 | 11/2005 | Liaw |
| 2007/0097756 A1* | 5/2007 | Hirota et al. .......... 365/189.09 |
| 2007/0121371 A1* | 5/2007 | King .......................... 365/154 |
| 2007/0165448 A1* | 7/2007 | Itoh et al. .................... 365/154 |

OTHER PUBLICATIONS

Nakagome, Y., et al., "Review and Future Prospects of Low-Voltage RAM Circuits", IBM Journal of Research and Development, vol. 47, No. 5/6, pp. 525-552, Sep./Nov. 2003.
Yamaoka, M., et al., "0.4-V Logic Library Friendly SRAM Array Using Rectangular-Diffusion Cell and Delta-Boosted-Array-Voltage Scheme", 2002 Symposium on VLSI Circuits, Digest of Technical Papers, 4 pages.
Khellah, M., et al., "A 4.2GHz 0.3mm² 256kb Dual-$V_{cc}$ SRAM Building Block in 65 nm CMOS", ISSCC 2006/Session 34/SRAM/ 34.2, 2006 IEEE International Solid-State Circuits Conference, pp. 624-625 and 678.

* cited by examiner

*Primary Examiner*—Michael T Tran
(74) *Attorney, Agent, or Firm*—Slater & Matsil, L.L.P.

(57) ABSTRACT

A circuit and method for providing an SRAM memory with reduced power consumption, the SRAM memory particularly useful for embedding SRAM memory with other logic and memory functions in an integrated circuit. A lower supply voltage is provided to the peripheral circuitry for the SRAM memory. A level shifter circuit is provided coupled to the lower power supply and outputting a higher supply voltage. An array of SRAM memory cells that may comprise 4T, 6T or 8T static RAM memory cells are coupled to the higher supply voltage during read and write operations. Operating the peripheral circuitry of the SRAM memory at the lower supply voltage achieves reduced power consumption for the SRAM memory and the integrated circuit.

20 Claims, 7 Drawing Sheets

CIRCUIT AND METHOD FOR AN SRAM WITH REDUCED POWER CONSUMPTION

TECHNICAL FIELD

The present invention relates to a circuit and method for providing a static RAM ("SRAM") memory with reduced power consumption. This SRAM is particularly useful as an embedded SRAM in an integrated circuit including other functions such as user specified logic, processor, interface functions, other memory types, and the like. Peripheral circuitry for accessing the SRAM is provided adjacent an array of SRAM cells, and the power supplied to the peripheral circuitry and the power supplied to the array of cells is configured so as to reduce power consumption over SRAM memories of the prior art.

BACKGROUND

Highly integrated semiconductor circuits are increasingly important, particularly in producing battery operated devices such as cell phones, portable computers such as laptops, notebook and PDAs, wireless email terminals, MP3 audio and video players, portable wireless web browsers and the like, and these integrated circuits increasingly include on-board data storage. As is known in the art, such data storage may take the form of dynamic memory in which arrays of cells are provided, each cell is a storage capacitor formed with an associated adjacent access transistor. Dynamic memory offers excellent density and minimum required silicon area, however the need to frequently refresh the storage cells, and the loss of the stored data on power loss, makes this type of data memory less attractive in some respects, particularly for battery operated devices. Static RAM memory is therefore increasingly being incorporated into these large ICs, sometimes called "SOCs" or "systems on a chip". Typical applications for these embedded SRAMs or "e-SRAM" include for use as fast memory adjacent a processor such as cache memory, as register files, as fast scratchpad memory, for data pipelining or time conversion operations such as FIFOs, and for use in buffering applications such as frame buffers. SRAM offers two important and obvious advantages over DRAM, first, the data is available faster than for DRAM; and second, static RAM retains its stored data when power is lost. SRAM is particularly attractive when designing portable battery-operated equipment where it is expected that power will suddenly be lost as the battery becomes exhausted.

In conjunction with the increasing use of SRAMs embedded with various other logic circuitries on a single integrated circuit, (for example, ASIC or FPGA type integrated circuits) process technologies for manufacturing of integrated circuits continue to shrink. As the scaling of the dimensions of CMOS integrated circuitry gets smaller, certain dominant problematic effects such as the threshold voltage (Vt) mismatch occur including increased sub threshold leakage currents. These effects cause the minimum supply voltage Vcc required to correctly store and retrieve data in an embedded SRAM array (usually called "Vcc, min") to become a critical supply voltage limit. Thus for the proper programming and retention of data stored in an embedded static RAM block, a fairly high Vcc, minimum voltage has to be maintained. This in turn leads to undesirably larger power consumption, especially during stand-by cycles when the SRAM is not being actively operated. A known measure of this power consumption is the standby current, usually referred to as Isb. It is desirable therefore to reduce Isb to the minimum possible level, and this in turn creates a need to reduce the Vcc, min voltage supplied to the SRAM array.

Further, and as is often the case in the manufacture of semiconductor circuits, increasingly various functions are being integrated together into a single integrated circuit device to provide a total solution or system in one, or a few, integrated circuits. The use of embedded SRAM circuits is increasing, where an SRAM block including the associated peripheral driver circuitry, e.g. word line drivers, decoders, sense amps, column decoders and the like, are included in a library of verified reusable design functions which may be placed onto a single semiconductor device with other memory cells, logic cells, processor blocks such as ARM, DSP, microprocessor, or bus controller logic circuits, clocking circuitry, and so forth. This type of SRAM design may be described as an "ASIC library memory" or an e-SRAM (embedded SRAM). By including the embedded SRAM block with various other user defined functions implemented in logic circuitry, these integrated circuits incorporate many functions into a single SOC for use in a cellular phone, PDA, personal music player, laptop computer, portable wireless email terminal, etc.

A paper by Y. Nakagome et al. entitled "Review and Future Prospects for Low Voltage RAM Circuits", IBM Journal of Research and Development, Vol. 47, No. 5/6, pp. 525-552, September/November 2003, describes an industry estimate that these embedded memory functions may soon occupy more than 90% of the area of these Systems on a Chip (SOCs) integrated circuits. Thus the power consumption in these embedded SRAM memories is particularly important, and there is an ongoing need to reduce the power used in these SRAM memory blocks to as low a level as possible.

FIG. 1 depicts a typical prior art 6T SRAM cell comprised of four MOS transistors coupled to form a latch, and two MOS pass gates which selectively couple the data lines or bit lines to the cell, the data is passed into or out of storage nodes within the cell. Because the cell is a static RAM cell, the data will be retained as it was last stored, that is, the cell will remain as it was last programmed. U.S. Pat. No. 7,023,056, titled "Memory Cell Structure", assigned to the assignee of the present application and herein incorporated by reference, describes layout and semiconductor structures for efficiently providing both 6T SRAM cells as shown in FIG. 1, and similar 8T SRAM cells with dual ports, such as may be used for register files.

In operation, bit lines BL and BL_ of FIG. 1 are typically arranged in parallel and span an array of SRAM cells as either rows, or columns, with the cells arranged between them. Word lines WL (only one is shown) are typically ranged orthogonal to, and often perpendicular to; the bit lines BL (sometimes called data lines or DL) and form columns, or rows, respectively. Decoders and drivers not visible in FIG. 1, but described later herein, form so-called "peripheral" circuits that selectively activate the word lines and the bit lines to provide READ operations, where data stored on nodes A and B is provided to the bit lines BL and the complementary bit line BL_ by providing a word line voltage on WL sufficient to cause the pass gates PG1 and PG2 to couple the storage nodes to the bit lines. The state of the storage nodes will cause a differential voltage to form on the bit lines BL, BL_ which may represent either a logical one or logical zero state, the differential voltage is sensed by sense amplifiers (not visible in FIG. 1) that are coupled to the bit lines BL and BL_ as is known in the art. Similarly, for a WRITE operation, driver circuits that are coupled to the bit lines BL and BL_ provide complementary input data, which is coupled to the storage nodes of a selected DRAM cell. This is accomplished by providing a voltage at the word line WL that causes the pass gates PG1 and PG2 to couple the respective bit lines to the storage nodes node A and node B, the bit line drivers are designed with sufficient drive strength to overdrive the transistors MP1, MP2, MN1, MN2 which form a latch that is the static RAM cell. In this manner the drive circuits can program the storage nodes node A and node B with the data presented on the bit lines BL and BL_ during the write operation.

FIG. 1 shows only a single SRAM cell formed of 6 transistors, e.g. a "6T" cell. Practical SRAM blocks will include many thousands of these cells arranged in rows and columns with a plurality of bit lines and word lines arranged between them to form a SRAM cell array.

FIG. 2 (an illustrative and non-limiting example) depicts a portion of such an array as is known in the art, with four 6T SRAM cells as shown in FIG. 1. Each of the four cells labeled Cell 00, Cell 01, Cell 10, Cell 11 is an instance of, and identical to, the cell of FIG. 1. In FIG. 2, word line WL0 is coupled to and traverses Cells 00 and 01, word line WL1 is coupled to and traverses Cells 10, 11, bit lines BL0 and BL0_ are provided on either side of and are coupled to Cells 00, 10, and bit lines BL1 and BL1_ are provided on either side of, and are coupled to, Cells 01 and 11. To access a particular cell, it can be seen that the corresponding word line can be activated while the corresponding bit lines are either observed for a READ operation, or driven with input data for a WRITE operation. Sense amps (not shown) coupled to the complementary bit lines are used to sense the READ data, which appears in the form of a small differential voltage measured across the bit line pair, as is known in the art. Drivers (not shown) coupled to the bit lines likewise provide WRITE data on the respective bit line pairs for WRITE operations. Each SRAM cell has a row and column address and therefore may be individually addressed by a row decoder which provides an active voltage on one of the word lines, and a column decoder which activates the appropriate sense amp or bit line drivers on one of the bit line pairs, in this manner each storage cell has a unique physical address. The peripheral circuitry therefore provides the data input, data output, decoding, and sense amplifiers required for the surrounding circuitry to store data in, and access data from, the static RAM cells.

A prior art approach to addressing the power consumption and Vcc problem in an embedded SRAM (such as is shown in FIG. 2) is to provide varying supply voltages to the cells and bit lines in the SRAM array during the different operations. FIG. 3 depicts one example of this prior art approach. This implementation is described in U.S. Pat. No. 6,891,745, titled "Design Concept for SRAM Read Margin", to J. J. Liaw, which is also assigned to the assignee of the present application and which is herein incorporated by reference. FIG. 3 illustrates in a plan view the major blocks of the SRAM peripheral circuitry and the SRAM cell array to form SRAM 301.

In FIG. 3, sense amp and bit line decoders 303 are coupled to the bit lines BL (0:m) and BL_(0:m) to form a number of columns m+1 in the SRAM cell array 305. Word line driver circuitry 307 is provided and coupled to the word lines WL (0:n). Each word line forms a "row" in the array. Thus the array is an m+1 by n+1 cell array and an SRAM cell such as the one depicted in FIG. 1 is positioned at each word line, bit line intersection within the array.

In FIG. 3, an additional element is shown coupled to the word lines; this is a voltage generator labeled Vcc Select 309 that has outputs Vcc (0:n). This added circuitry provides an independent and dynamic supply voltage Vcc to each row of cells within the array. A decode operation is performed and the supply voltage is kept at an initial low voltage Vdd for all cells, however during READ operations, the selected cell row is provided with an enhanced supply voltage of Vdd+VPU (a pumped voltage over Vdd). This voltage may exceed the Vdd voltage by a multiple of 1.05 to 1.3. Write operations are conducted at the lower voltage Vdd, which improves the static noise margin (SNM) for write operations. Thus the array may be maintained at a lower operational supply voltage, however the row of cells being read during a READ operation are supplied with the higher voltage. This higher supply voltage increases the SRAM cell static noise margin (SNM) to acceptable levels that are not otherwise possible with the lower supply voltage. This prior art approach also requires that in the decoding circuitry associated with the cell array, the circuitry usually referred to in the art as the "peripheral circuitry" or "peri", a "y-select" circuit is implemented to selectively provide different positive voltage levels Vdd to the selected rows of cells in the array during the reads. A pump or boost circuit is also needed to form the higher supply voltage Vdd+VPU. This prior art approach thus adds silicon area to the SRAM array and to the peripheral circuitry, which is undesirable as it reduces the amount of storage that can be provided in the embedded SRAM for a given application.

Another similar proposed approach is described in a paper entitled "0.4-V Logic Library Friendly SRAM Array using rectangular diffusion cell and delta boosted array voltage scheme", by Masanao Yamaoka et al, 2002 Symposium on VLSI Circuits, Digest of Technical Papers which publication is herein incorporated by reference. In this scheme, the supply voltage provided to the SRAM cell array for an embedded SRAM function is boosted over the Vdd level during active cycles, but is placed at a lower standby voltage during inactive cycles. This approach also requires a boost voltage generator which requires additional area and significant circuit complexity, in addition, the load transistors (P type) and the driver transistors (N type) in the SRAM cell have to be formed with specific different thresholds, to improve the noise margin operation of the SRAM cell during WRITE operations.

Table 1 depicts voltages used during the operation of an SRAM array with the "y-select" prior art approach to the Vcc minimum problem.

TABLE 1

| Operation | Cell Area Vdd CVdd | Cell Area BL Vddc | Peripheral Circuit Vddp | Note |
|---|---|---|---|---|
| READ | High Vddp + 10% | Low Vddp − 10% | Low Vdd − 10% | Requires y select circuit, 20% area penalty |
| WRITE | Low Vddp − 10% | High Vddp + 10% | Low Vdd − 10% | |

From Table 1, the voltages applied during a READ cycle are Vddp+10% for the cell area, Vddp−10% for the bit line driver, and Vdd−10% for the peripheral circuits. For the WRITE cycle, the voltages are Vddp−10% for the cell area, and Vddp+10% for the bit line drivers, while the peripheral circuitry remains at Vdd−10%.

Table 2 shows a power consumption and area penalty comparison for different design solutions. In Table 2, an SRAM array is shown with no power reduction, and is compared with the reduced power solution of the prior art. For the area penalty concern, the prior art reduced power solutions require added logic circuitry and decoders, typically referred to as "y select" circuitry, and additional voltage booster or pump circuitry, to provide these required dynamic supply voltages to the various SRAM cell elements at the correct point in time. This kind of design also needs a so-called voltage down converter (VDC) to adjust the CVdd and Vdd voltage. This added circuitry and the associated routing required adds about 18% in silicon area to the embedded SRAM block over designs without these features.

There is also the speed concern for the prior art reduced power design. Due to the fact that CVDD will change from high to low from read to write operations, and VCC will change from low to high for the read to write operation, the SRAM array speed is limited, to wait for these voltage states to change. Speed is also another concern for the designs where VDD and CVDD are lowered, because the SRAM cell current is also reduced, the SRAM speed is therefore slower at lower voltage.

The power consumption for this prior art VDC design can improve the peri power to 62.5% (0.78/1.25=62.4%) of the original consumption when the peri voltage is lowered down from 1.1V to 0.85V. However, the array power is increased 25% ((1.25−1)/1=25%), due to the voltage for the array coming from the I/O voltage (1.8V). So the overall power shrinkage is limited to 10% ((2.25−2.03)/2.25=10%) improvement. The SRAM speed/current will also be reduced to around 40%, this is undesirable.

A need thus exists for an area efficient and cost effective solution to the problem of lowering the supply voltage to the SRAM that lowers the power consumption of the SRAM block, while maintaining proper noise margins and ensuring correct data retention.

an input to the level shifter, the level shifter will output a high supply voltage to the array of SRAM cells only when needed, this selection is logically based on the supply voltage supplied to the peripheral circuitry.

Integrated circuits incorporating the reduced power SRAM of the invention may embed the SRAM with various other functions including processors, additional embedded SRAM blocks using the reduced power of the invention, interface blocks, I/O circuitry, clocking circuitry, DAC/ADC converters, and the like, to form large systems on a chip (SOCs) as is known in the art. The SRAM cells may be formed of 6T cells for a single ported SRAM, 8T cells for a dual ported SRAM, or 4T cells or other reduced area SRAM cells, as is known in the art.

If more than one of the SRAM blocks with reduced power is used in an integrated circuit, the individual instances of the SRAM blocks may be operated at different voltages, or at the same voltages, as best suits a given application.

The voltages used in the peripheral circuitry, the bit lines, and the cell array may be varied. In a preferred embodiment, an active mode for the SRAM block is supported, in this mode the array of SRAM cells receives the first voltage, a high Vdd supply from the level shifter, the peripheral circuits are operated at a second voltage lower than the first voltage but greater than 90% of the first voltage, and the bit lines receive the first voltage during read or write operations.

In another preferred embodiment, a stand-by mode is supported. In this mode the array of SRAM cells receives the first voltage, a high Vdd supply from the level shifter, the peripheral circuits are operated at a second voltage lower than the first voltage but greater than 80% of the first voltage

TABLE 2

| Design Solution Methodology | Vcc, min improvement +/−V to Vdd | Min Supplied Vcc | Area Penalty/ Array Density | Power Performance | | | SRAM Speed |
|---|---|---|---|---|---|---|---|
| | | | | Total Power | Array Power | Peri Power | |
| no design solution | 0 V | 1.1 V | Compared base | 2.25 | 1 (compared base) | 1.25 | 1 (compared base) |
| Prior Art reduced Vcc | +/−10%, Vmax 1.25 V | 0.85 V | 18%/256K | 2.03 | 1.25 | 0.78 | 0.4 |

SUMMARY OF THE INVENTION

These and other problems are generally solved or circumvented, and technical advantages are generally achieved, by embodiments of the present invention, which provide circuits and methods of forming an SRAM block for use in an integrated circuit which solves the Vcc, minimum problem described above by providing a reduced voltage to the peripheral circuitry associated with the SRAM block, providing a higher supply voltage to the SRAM cell array during active cycles, and providing a level shifter circuit to supply the higher supply voltage during active cycles. The level shifter circuitry is a simple circuit that requires only 2% additional area over the existing circuitry. The power saved by operating the peripheral circuitry at the lower level is significant, estimated at 15% power savings for a typical current semiconductor process node. The SRAM block may be implemented with sleep or power down modes, stand-by modes, and active modes, by varying the voltage supplied as and less than 90% of the first voltage, and the bit lines receive the first voltage during read or write operations.

In another preferred embodiment, a sleep mode is supported. In this mode the array of SRAM cells receives the first voltage, a high Vdd supply from the level shifter, the peripheral circuits are operated at a second voltage lower than the first voltage and less than 80% of the first voltage, and the bit lines receive the first voltage during read or write operations.

In another preferred embodiment, the SRAM block may include a first array of cells with 6T SRAM cells, and a second array of cells with 8T SRAM cells, and the first and second blocks may have peripheral circuits associated with each of them and may then operate at different second voltages or in different modes of operation. Alternatively, multiple SRAM blocks of different cell types and different voltages may be used.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
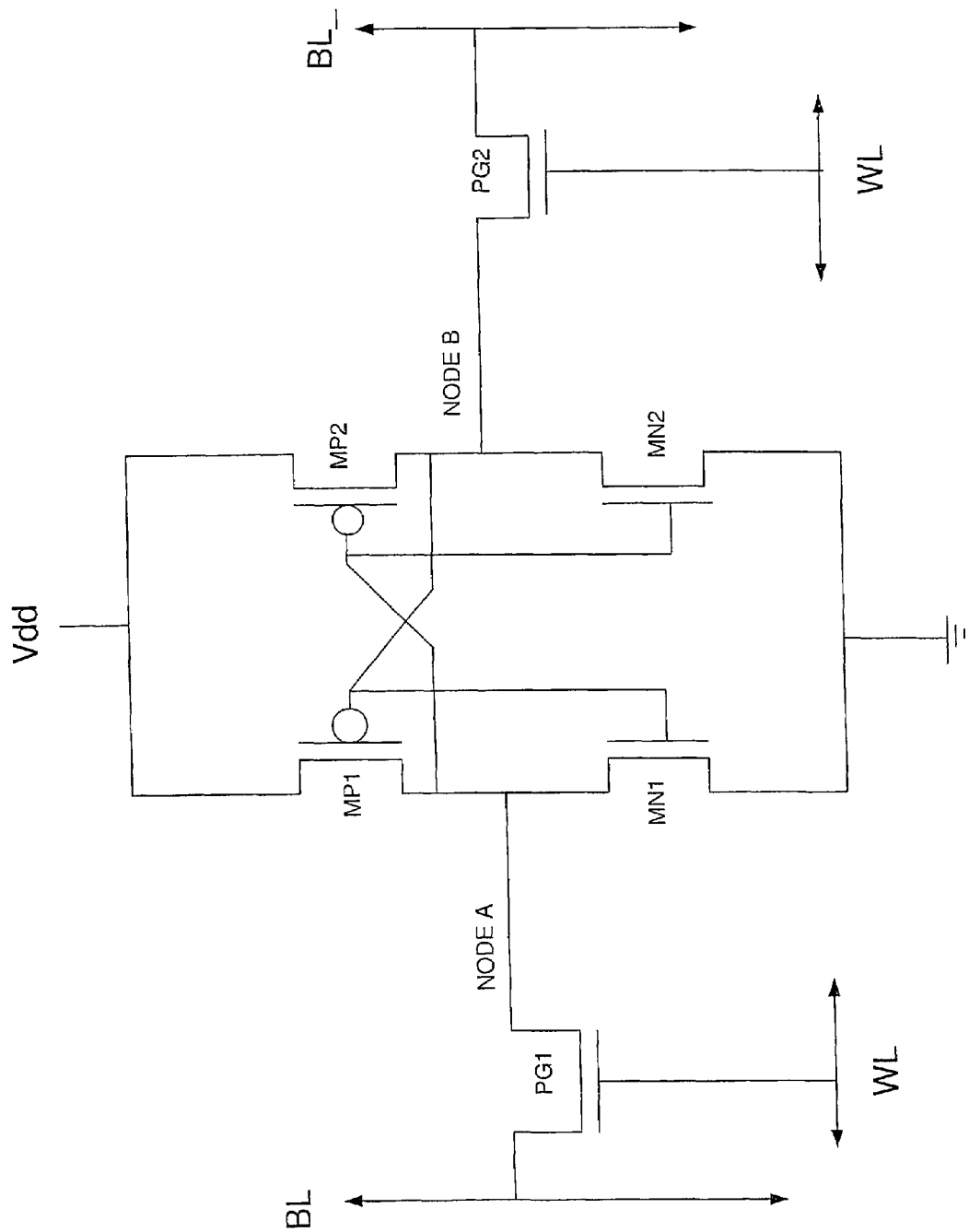
FIG. 1 illustrates an SRAM cell of the prior art.
Figure 2:
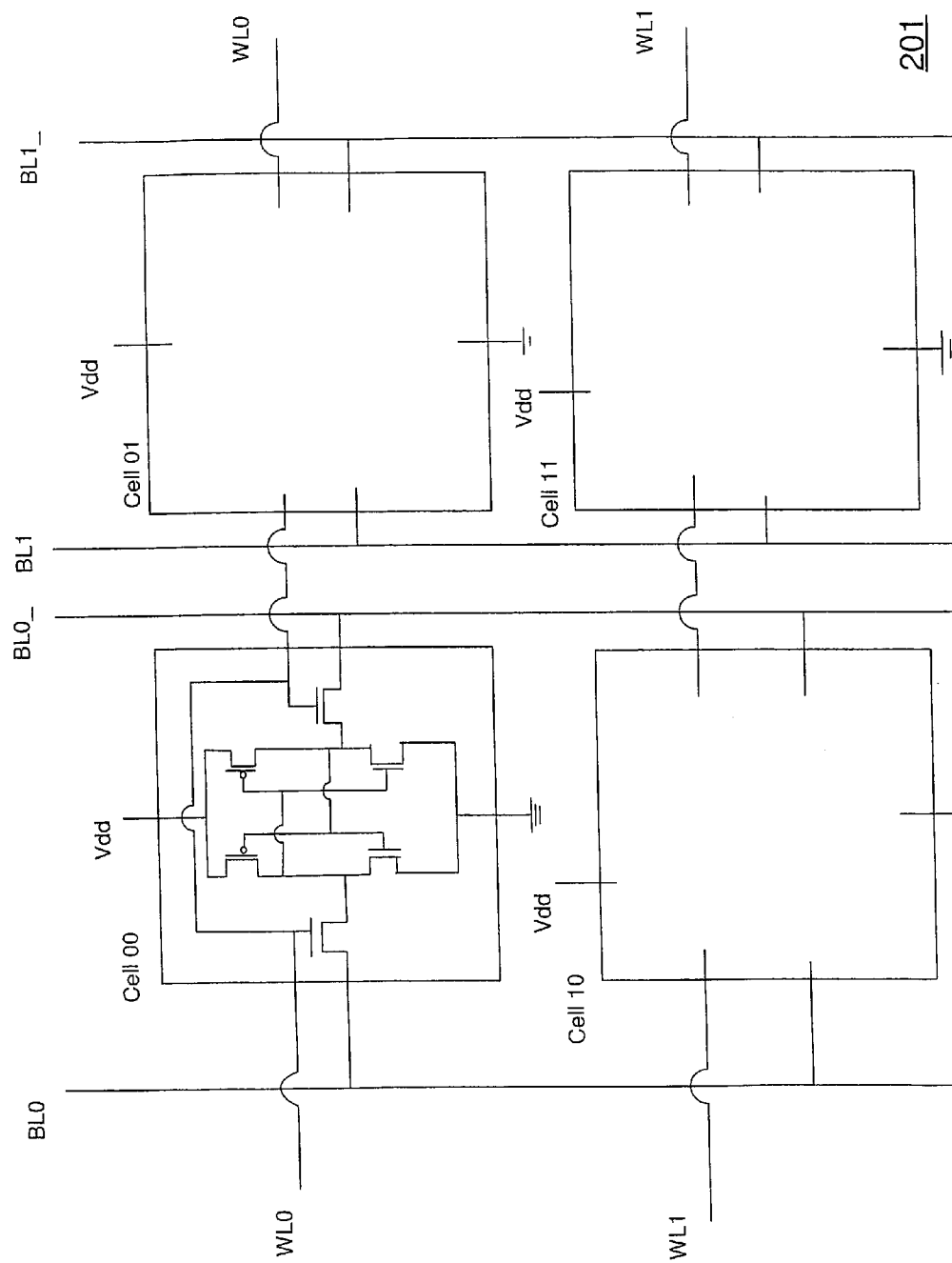
FIG. 2 illustrates a simplified block diagram of a portion of an SRAM cell array of the prior art.
Figure 3:
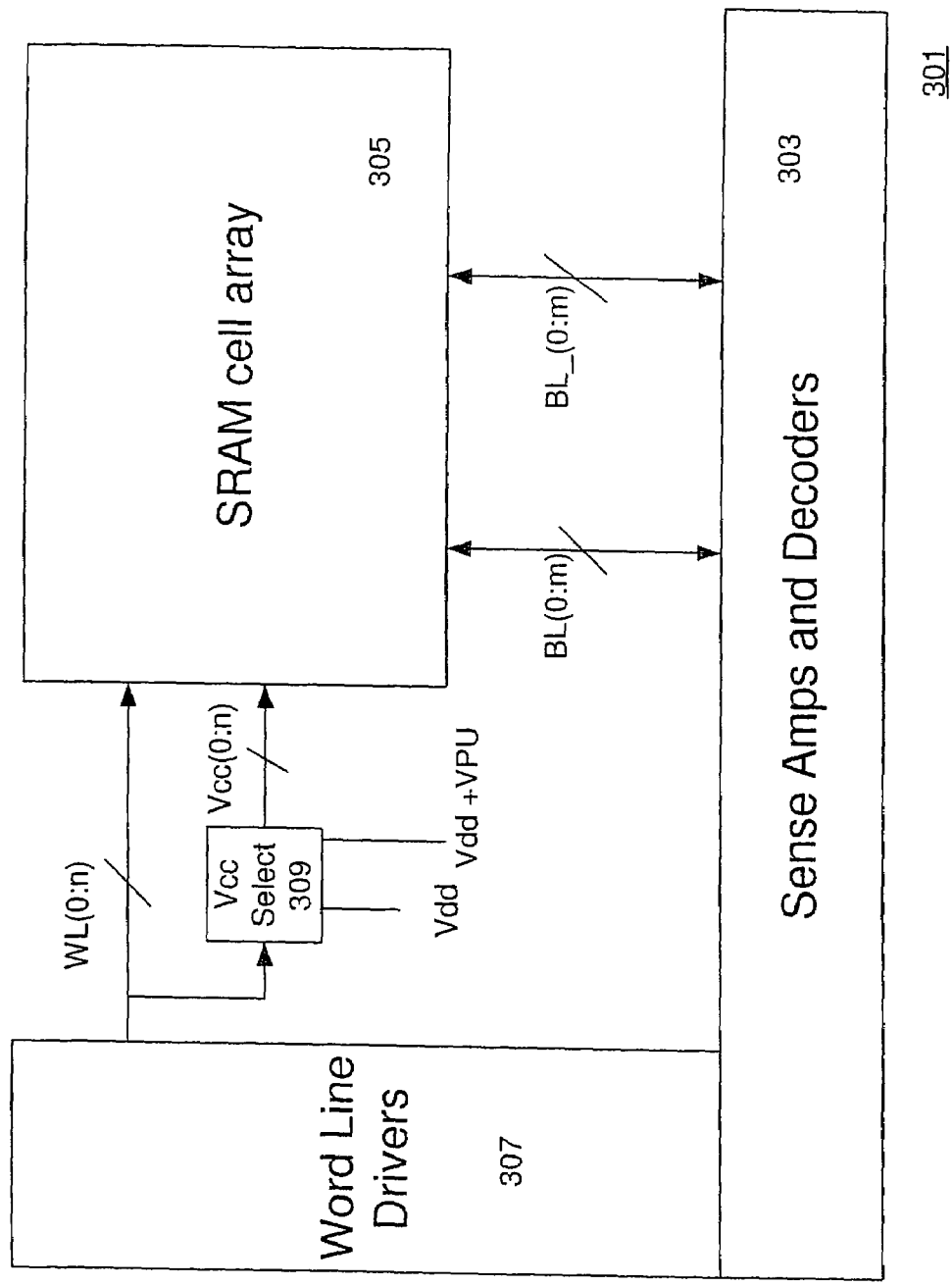
FIG. 3 illustrates in a simple plan view an SRAM block of the prior art.
Figure 4:
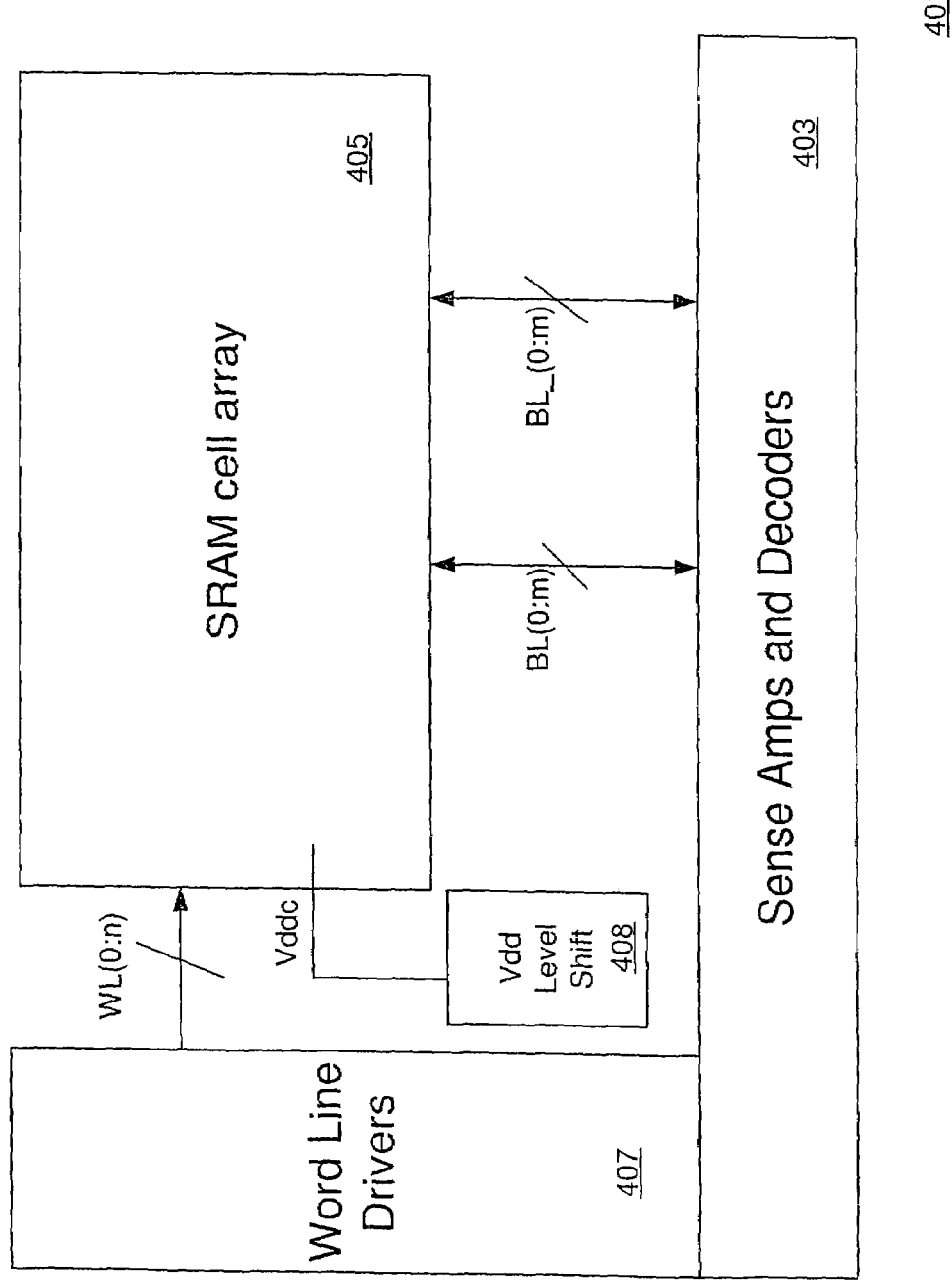
FIG. 4 illustrates in a simple plan view an SRAM block incorporating the features of the present invention.

FIG. 4 depicts in a simple plan view, the major blocks of an SRAM array 401 incorporating the reduced power approach of the invention. Sense amps and decoders 403 are provided and are coupled to complementary bit lines BL (0:m) and BL_(0:m), which define columns (or rows) in SRAM cell array 405. Word line drivers 407 provide decoding and drive a selected word line for a read, write operation, the word lines WL (0:n) defining rows (or columns) in SRAM cell array 405. There is an SRAM cell at each word line, bit line intersection that may be a 6T SRAM cell as depicted in FIG. 1, or, an 8T SRAM cell that is dual ported. Alternative SRAM cells that are known in the art are also contemplated, such as "loadless" 4T cells, and other reduced transistor count SRAM cells may be used.

In operation, Vdd Level Shift 408 supplies the 'Vddq high voltage' to all of the SRAM cells in the cell array 405. Unlike the prior art approach of supplying a dynamic voltage (which changes with operation) to the cells, requiring an additional decoding circuit, the Vdd Level Shift 408 of FIG. 4 is coupled to all of the SRAM cells in the array, simplifying the route and adding no additional area over a simple prior art cell array with a single Vdd supply. The level shift circuit 408 provides a supply voltage that is higher than the voltage Vdd provided to the peripheral circuitry, that is, the word line drivers 407 and sense amps and decoders 403 are operated at a lower supply voltage, in a given example it might be 0.8 Volts or a similar Vdd voltage that is supplied to the core logic circuitry of the device. Level shift circuit 408 then supplies the SRAM cells with a voltage that exceeds this low supply voltage, such as 1.1 Volts. Typical design margin practices are contemplated so that the shifted voltage may exceed a nominal design voltage by 10%, to ensure the higher voltage remains high enough over temperature cycles and in spite of process variations.

Figure 5:
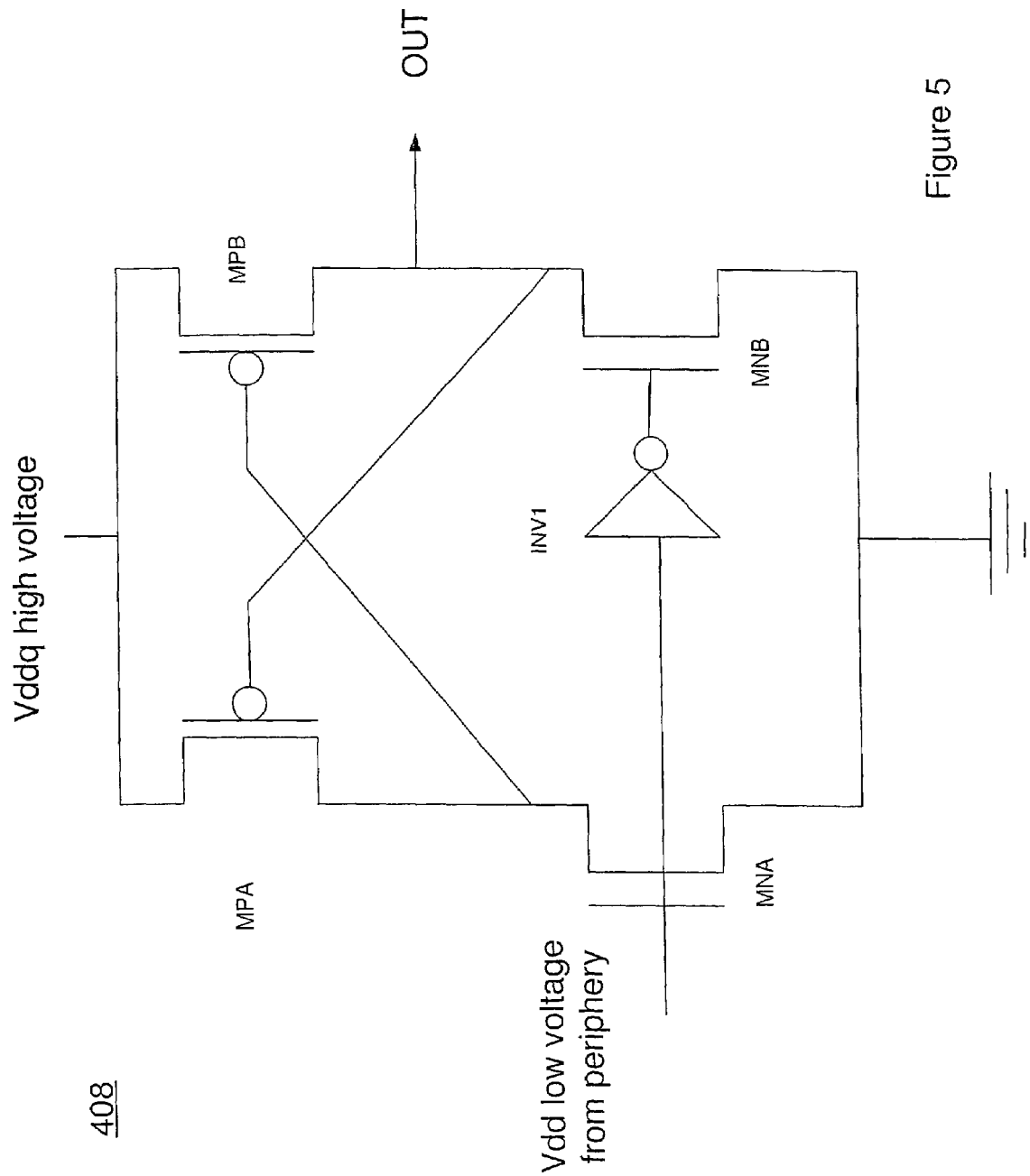
FIG. 5 illustrates a schematic view of one preferred embodiment of a level shifter to be used with the SRAM block of FIG. 4.

FIG. 5 depicts a preferred embodiment of the level shifting circuit 408. In this embodiment, n-type transistors MNA and MNB are coupled to the input voltage Vdd low that is supplied to the peripheral circuitry. During an active or stand by cycle, the Vdd low voltage will be present and exceed the threshold voltage Vt for the input transistor MNA. When that transistor is active, the drain will be pulled down to the ground potential (or Vss) and transistor MPB, a P-type MOS load transistor, will become active due to the voltage being lower than the Vddq high voltage by more than its turn on threshold, Vt, and this load or pull up transistor MPB will therefore couple the output node OUT to the Vddq High Voltage. When the input voltage Vdd Low Voltage coupled to INVI is lower than a threshold Vt above ground, the inverter will turn on N-type MOS transistor MNB that will therefore couple the output OUT to ground. As the Vdd low voltage to the peripheral circuitry rises above a Vt, the level shifter circuit of FIG. 5 will couple the output OUT to the stepped up voltage Vddq High Voltage, and the array of SRAM cells will become powered at that higher level.

FIG. 5 depicts just one known example preferred circuit for providing the level shifter 408. Those skilled in the art will recognize that other circuits, including for example voltage references, on-board regulators, pumps, boosts and the like could be used as alternatives. These alternative approaches are contemplated as part of the invention and are covered by the appended claims.

The invention thus provides the peripheral SRAM circuitry with a lower supply voltage than the SRAM cell array, and correspondingly lowers power consumption, while simultaneously providing a higher supply voltage to the SRAM cell array, thus ensuring the Vcc, minimum requirement to maintain proper static noise margins for a particular technology process node is always satisfied. The use of the lower power supply to the peripheral circuitry is estimated to save about 15% of power over the SRAM circuit operated without the use of the invention. Importantly, the level shifter of the invention adds only 2% layout area to the SRAM block without the use of the invention. This is in contrast to a 20% area penalty for the "y-select" dynamic voltage approach of the prior art SRAM blocks.

In the circuit, of the prior art, speed was a concern due to the dynamic voltage switch. In contrast, with the present invention, due to the SRAM CVDD and VDD always being the same voltage, there is no speed impact due to the dynamic voltage switch. Further, due to the SRAM CVDD and VDD always being at high levels the SRAM array read and write current is higher, so the SRAM operation speed is higher.

Table 3 depicts a comparison of the supply voltages used in the different areas of the peripheral circuits and the reduced power SRAM cell array of the present invention and the prior art "Y select" approach.

TABLE 3

| Operation | Cell Area Vdd CVdd | Cell Area BL Vddc | Peripheral Circuit Vddp | Note |
|---|---|---|---|---|
| Prior Art Approach | | | | |
| READ | High Vddp + 10% | Low Vddp − 10% | Low Vdd − 10% | Requires y select circuit, 20% area penalty |
| WRITE | Low Vddp − 10% | High Vddp + 10% | Low Vdd − 10% | Writes differ from reads to maintain margin |
| Level shifting Voltage (Present Invention) | | | | Simple route. Requires only 2% SRAM area penalty. |
| READ | High Vdd | High Vdd | Low Vdd − 20% | Vdd is nominal for process node |
| WRITE | High Vdd | High Vdd | Low Vdd − 20% | | will meet the required Vcc minimum for the SRAM array cells, while the peripheral circuits continue to operate at the lower voltage.

In additional preferred embodiments, the SRAM block supports modes such as a sleep mode, standby mode, and active mode. In these various modes, the peripheral circuitry may receive different voltages. In each case the SRAM cells receive the higher voltage from the level shift circuit that meets or exceeds the Vcc, minimum required for a particular process node.

Figure 6:
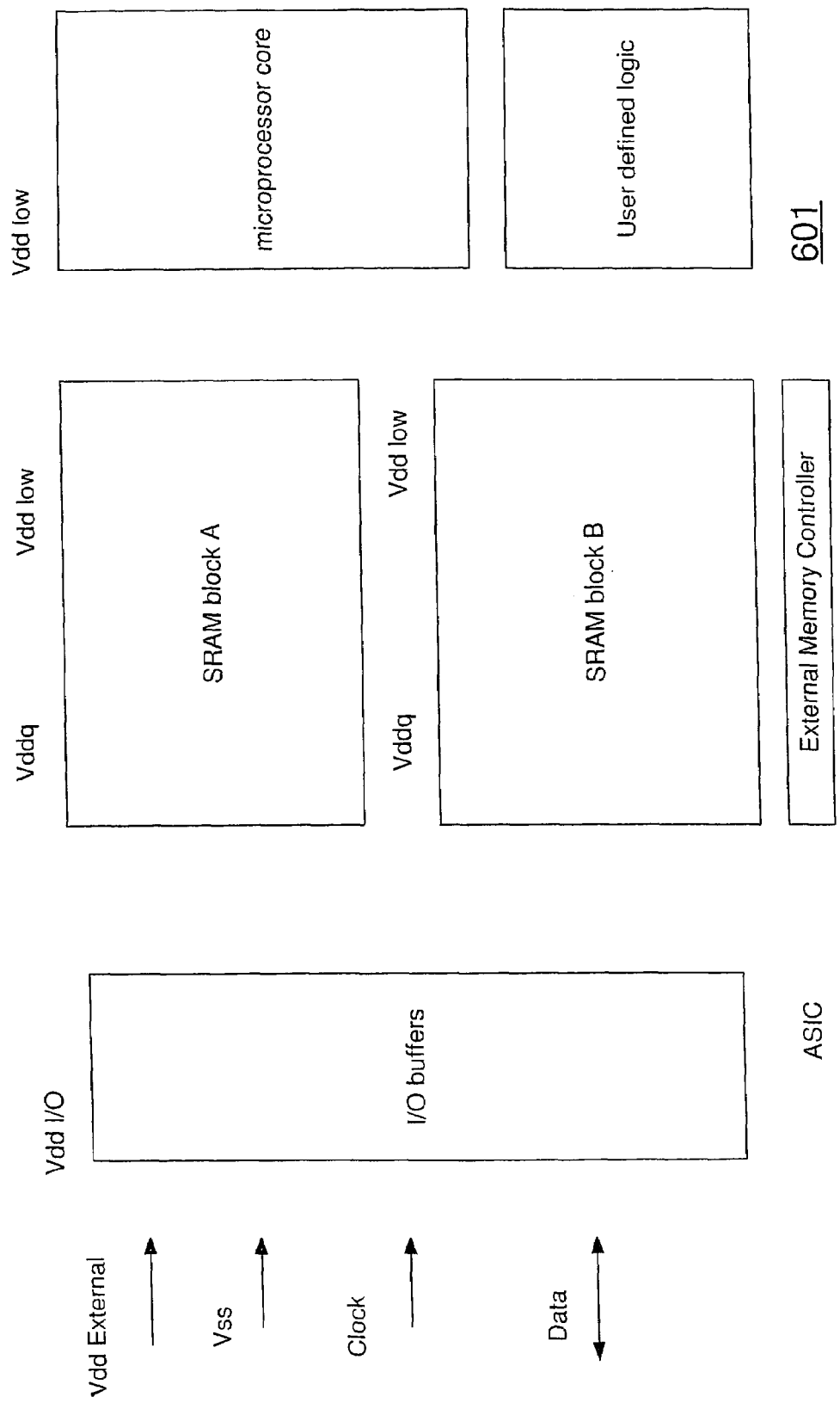
FIG. 6 illustrates a block diagram view of an IC incorporating two SRAM blocks of the invention, an I/O buffer, a microprocessor core, and user-defined logic to form an SOC incorporating the invention.

FIG. 6 illustrates an example IC 601 implemented using reusable IP cores in an ASIC or FPGA design methodology, as is known in the art. IC 601 involves I/O buffers, a first SRAM block A, a second SRAM block B, a microprocessor core such as an ARM core, MIPS core, etc. and user-defined logic. The SRAM blocks A and B use the reduced power supply approach of FIG. 4 and incorporate the invention. The SRAM blocks A and B may incorporate the 6T cell of FIG. 1, or use an 8T cell. In one preferred embodiment, the SRAM block A may incorporate the 6T cell of FIG. 1, while the SRAM block B may use a dual part 8T cell. In another preferred embodiment, the two SRAM blocks A and B may operate at different supply voltages. The two SRAM blocks A and B may support different modes of operation such as

TABLE 4

| Design Solution Methodology | Vcc, min improvement | | Area Penalty/ Array Density | Power Performance | | | SRAM Speed |
|---|---|---|---|---|---|---|---|
| | +/−V to Vdd | Min. Supplied Vcc | | Total Power | Array Power | Peri Power | |
| No design solution | 0 V | 1.1 V | compared base | 2.25 | 1 (compared base) | 1.25 | 1 (compared base) |
| Prior Art approach | +/−10% Vmax 1.25 V | 0.85 V | 18%/256K | 2.03 | 1.25 | 0.78 | 0.4 |
| This Invention | Varray = 1.1 V, Vperi = 0.75 V | 0.75 V | 2.5%/256K | 1.5 | 1 | 0.5 | 1 (compared base) |

Table 4 illustrates a comparison of the prior art approaches as shown in Table 2 to the present invention. In one example, for a current semiconductor technology process node of 45 nanometers (nm) minimum feature size, the high Vdd voltage in the SRAM array may be 1.1V. The SRAM peripheral circuits may be provided with the voltage 0.75V, which is similar to that of the other logic circuitry on the IC. For an integrated SOC type device, one skilled in the art will recognize that various Vcc voltages may be used, for example a battery powered IC device application may start with a 3.3 Volt external supply, this is then stepped down to perhaps 1.8V and that Vdd I/O voltage is used for supplying input/output buffers, clock drivers and the like, and then the core logic circuitry may operate at an additional stepped down voltage of 0.75V. The array power is the same as "no design solution" and the peri power is only 40% (0.5/1.25=40%) of the original power. So the total power is 67% (1.5/2.25=67%) of the "no design solution."

In a preferred embodiment, the SRAM peripheral circuitry including the sense amps, decoders, and word line drivers of FIG. 4 will operate at this lower supply voltage. The level shifter circuit 408 of FIG. 5 or another level shifter is then used to shift this voltage up to the voltage Vddq High Voltage, which may be for example 1.1 Volts. This voltage the active, stand-by and sleep modes described above. The two SRAM blocks A and B may operate in different modes at a particular point in time.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

Figure 7:
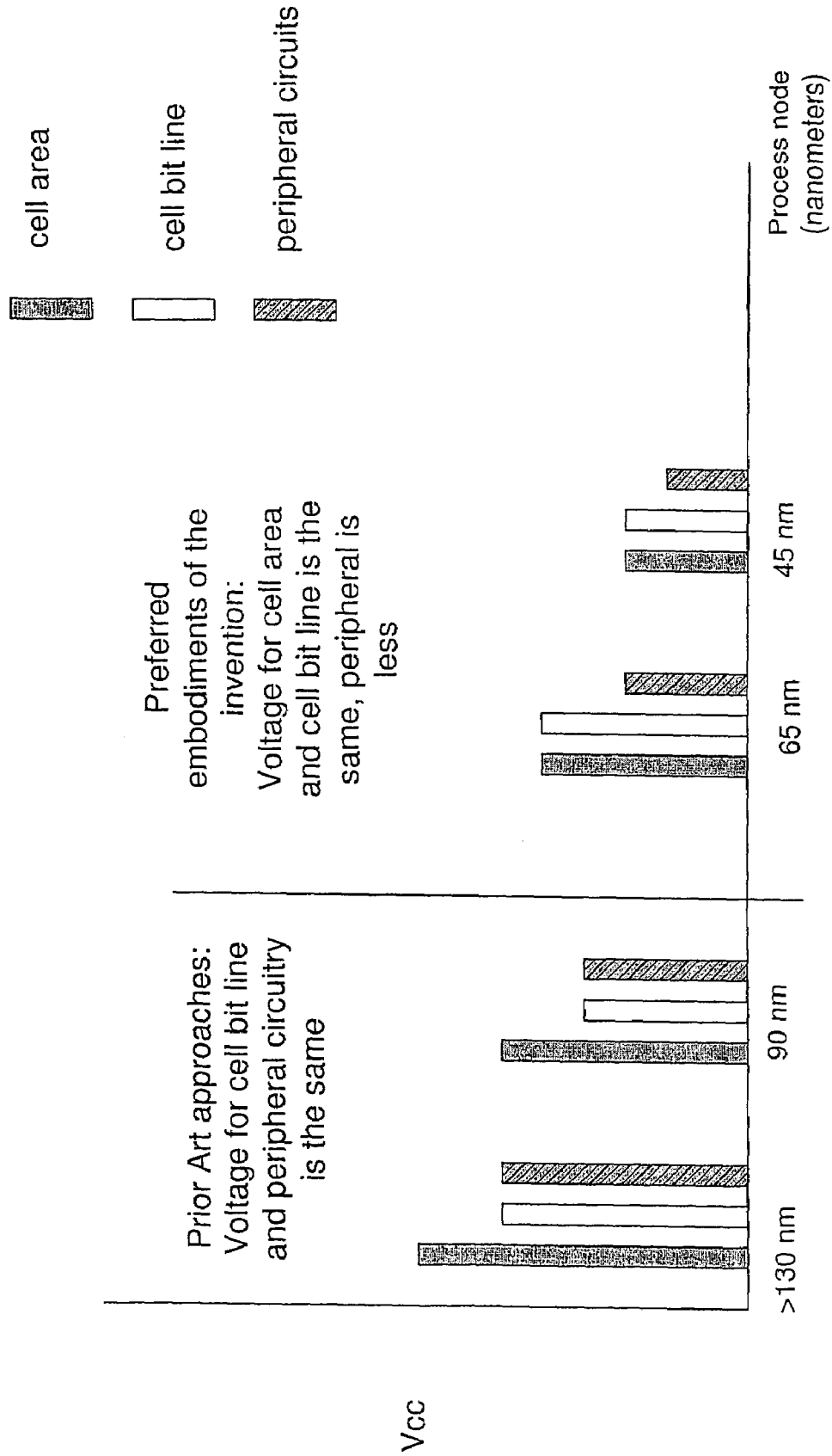
FIG. 7 illustrates, in graphical form, a comparison of the operating voltages supplied to the cell area, the bit lines, and the peripheral circuitry, for a memory device implemented in the process nodes of the prior art, and for a memory device implemented in the smaller process nodes of the present art which further incorporates the invention.

FIG. 7 illustrates a graphical comparison of the operating comparison of the operating voltages of a typical memory device implemented in the process nodes of the prior art compared to a memory device implemented in the smaller process nodes of the present art, (65 nm and less), and which also incorporates the level shifting approach of the present invention.

What is claimed is:

1. A reduced power SRAM memory, comprising:
an array of SRAM cells operating at a first supply voltage during read or write operations;
bit lines coupled to the array of SRAM cells supplied with the first supply voltage during read or write operations;
peripheral circuitry associated with the array of SRAM cells supplied by a second supply voltage during read or write operations, the second supply voltage being lower than the first supply voltage; and
a level shifter circuit coupled to the second supply voltage, and coupled to the first supply voltage, and operable to output the first supply voltage to the array of SRAM cells responsive to the second supply voltage.

2. The reduced power SRAM memory of claim 1, the SRAM memory supporting an active mode of operation, wherein the second supply voltage is greater than 90% of the first supply voltage during the active mode of operation.

3. The reduced power SRAM memory of claim 1, the SRAM memory supporting a stand-by mode of operation, wherein the second supply voltage is between 80% and 90% of the first supply voltage during stand by modes of operation.

4. The reduced power SRAM memory of claim 1, the SRAM memory supporting a sleep mode of operation, wherein the second supply voltage is less than 80% of the first supply voltage during the sleep mode of operation.

5. The reduced power SRAM memory of claim 1, wherein the array of SRAM cells each comprises a 6T SRAM cell.

6. The reduced power SRAM memory of claim 1, wherein the array of SRAM cells each comprises an 8T SRAM cell.

7. The reduced power SRAM memory of claim 1, and further comprising:
a second array of SRAM cells;
the second array of SRAM cells further having peripheral circuits associated with the second array of SRAM cells supplied by a third voltage supply that is less than the first voltage supply.

8. The reduced power SRAM memory of claim 7, wherein the third voltage supply is the same as the second voltage supply.

9. The reduced power SRAM memory of claim 7, wherein the third voltage supply is different from the second voltage supply.

10. The reduced power SRAM memory of claim 7, wherein the second array of SRAM cells each comprises an 8T SRAM cell.

11. An integrated circuit including an embedded SRAM memory, comprising:
logic circuitry coupled to implement a user defined functionality; and
a reduced power SRAM block coupled to said logic circuitry, the reduced power SRAM block comprising:
an array of SRAM cells supplied by a first voltage supply during read or write operations;
bit lines coupled to the SRAM cells and supplied by the first voltage supply during read or write operations;
peripheral circuitry associated with the array of SRAM cells and supplied by a second voltage supply, the second voltage supply being lower than the first voltage supply; and
a level shifting circuit coupled to said second voltage supply and coupled to said first voltage supply and outputting said first voltage supply to said array of SRAM cells responsive to said second voltage supply.

12. The integrated circuit of claim 11, wherein the SRAM block supports an active mode, the second voltage supply being greater than 90% of the first voltage supply during the active mode.

13. The integrated circuit of claim 11, wherein the SRAM block supports a stand-by mode, the second voltage supply being greater than or equal to 80% but less than 90% of the first voltage supply during the stand-by mode.

14. The integrated circuit of claim 11, wherein the SRAM block supports a sleep mode, the second voltage supply being less than or equal to 80% of the first voltage supply during the sleep mode.

15. The integrated circuit of claim 11, wherein the array of SRAM cells each comprises a 6T SRAM cell.

16. The integrated circuit of claim 11, wherein the array of SRAM cells each comprises an 8T SRAM cell.

17. A reduced power SRAM memory, comprising:
an array of SRAM cells operating at a first supply voltage during read or write operations;
bit lines coupled to the array of SRAM cells supplied with the first supply voltage during read or write operations;
peripheral circuitry associated with the array of SRAM cells supplied by a second supply voltage during read or write operations, the second supply voltage being lower than the first supply voltage; and
wherein the second supply voltage is between 80% and 90% of the first supply voltage during a stand by mode of operation.

18. The SRAM of claim 17, and further comprising a level shifting circuit coupled to the second voltage supply, and coupled to the first voltage supply and outputting the first voltage supply to the array of SRAM cells responsive to the second voltage supply.

19. The SRAM of claim 17, wherein the SRAM supports an active mode, the second voltage supply being greater than 90% of the first voltage supply during the active mode.

20. The SRAM of claim 17, wherein the SRAM supports a sleep mode, the second voltage supply being less than or equal to 80% of the first voltage supply during the sleep mode.

* * * * *

UNITED STATES PATENT AND TRADEMARK OFFICE
CERTIFICATE OF CORRECTION

PATENT NO. : 7,359,272 B2 Page 1 of 1
APPLICATION NO. : 11/506438
DATED : April 15, 2008
INVENTOR(S) : Wang et al.

It is certified that error appears in the above-identified patent and that said Letters Patent is hereby corrected as shown below:

On the title page item (54) and col. 1, line 1, after CIRCUIT delete "AND METHOD".
In Col. 5, line 11, delete "CVDD" and insert --CVdd--.
In Col. 5, line 12, delete "VCC" and insert --Vcc--.
In Col. 5, line 16, delete "VDD" and insert --Vdd--.
In Col. 5, line 16, delete "CVDD" and insert --CVdd--.
In Col. 8, line 62, delete "CVDD" and insert --CVdd--.
In Col. 8, line 62, delete "VDD" and insert --Vdd--.
In Col. 8, line 64, delete "CVDD" and insert --CVdd--.
In Col. 8, line 65, delete "VDD" and insert --Vdd--.

Signed and Sealed this

Twenty-second Day of July, 2008

JON W. DUDAS
*Director of the United States Patent and Trademark Office*